US010319817B2

(12) United States Patent
Reznicek

(10) Patent No.: US 10,319,817 B2
(45) Date of Patent: Jun. 11, 2019

(54) LATTICE MATCHED EPITAXIAL OXIDE LAYER FOR A SUPER STEEP RETROGRADE WELL

(71) Applicant: International Business Machines Corporation, Armonk, NY (US)

(72) Inventor: Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/701,312

(22) Filed: Sep. 11, 2017

(65) Prior Publication Data

US 2019/0080910 A1   Mar. 14, 2019

(51) Int. Cl.
| | |
|---|---|
| *H01L 29/10* | (2006.01) |
| *H01L 21/265* | (2006.01) |
| *H01L 21/8238* | (2006.01) |
| *H01L 27/092* | (2006.01) |
| *H01L 29/167* | (2006.01) |
| *H01L 29/66* | (2006.01) |

(52) U.S. Cl.
CPC .... *H01L 29/1083* (2013.01); *H01L 21/26513* (2013.01); *H01L 21/823821* (2013.01); *H01L 27/092* (2013.01); *H01L 29/167* (2013.01); *H01L 29/66795* (2013.01)

(58) Field of Classification Search
CPC ........... H01L 29/1083; H01L 29/66795; H01L 21/823821; H01L 27/092; H01L 29/167
See application file for complete search history.

(56) References Cited

U.S. PATENT DOCUMENTS

| | | | |
|---|---|---|---|
| 6,296,741 B1 | 10/2001 | Pinarbasi | |
| 6,617,037 B2 | 9/2003 | Sun et al. | |
| 6,653,185 B2 | 11/2003 | Gutsche et al. | |
| 7,666,512 B2 | 2/2010 | Bhatia et al. | |
| 8,865,561 B2 | 10/2014 | Cheng et al. | |
| 9,257,536 B2 | 2/2016 | Adam et al. | |
| 9,496,132 B2 | 11/2016 | Arkun et al. | |
| 9,666,486 B1 | 5/2017 | Ebrish et al. | |
| 2001/0028084 A1* | 10/2001 | Mo | H01L 29/7813 257/330 |
| 2003/0008521 A1* | 1/2003 | Bojarczuk, Jr. | B82Y 10/00 438/752 |
| 2005/0255648 A1 | 11/2005 | Bhatia et al. | |
| 2007/0065672 A1 | 3/2007 | Bhatia et al. | |
| 2007/0221956 A1* | 9/2007 | Inaba | H01L 21/823807 257/197 |
| 2010/0327377 A1 | 12/2010 | Dewey et al. | |
| 2012/0104567 A1 | 5/2012 | Clark et al. | |
| 2015/0318377 A1* | 11/2015 | Cheng | H01L 29/0638 257/349 |
| 2015/0325699 A1* | 11/2015 | Zhu | H01L 29/7845 257/192 |
| 2017/0179274 A1* | 6/2017 | Karve | H01L 29/66537 |

FOREIGN PATENT DOCUMENTS

DE          10114956 A1     10/2002

* cited by examiner

*Primary Examiner* — Feifei Yeung Lopez
(74) *Attorney, Agent, or Firm* — Patterson + Sheridan, LLP

(57) ABSTRACT

Aspects of the present disclosure include a structure and method of making a semiconductor device. The method includes: providing a substrate, implanting a portion of the substrate to form a PTS layer, and epitaxially growing an oxide layer over the PTS layer, where the epitaxial oxide layer is selected to be lattice matched in relation to the silicon substrate.

15 Claims, 4 Drawing Sheets

LATTICE MATCHED EPITAXIAL OXIDE LAYER FOR A SUPER STEEP RETROGRADE WELL

BACKGROUND

1. Technical Field

The present application relates to a semiconductor structure and a method of forming the same. More particularly, the present application relates to a semiconductor structure that includes an epitaxially grown oxide layer over a doped semiconductor substrate, where the epitaxial oxide acts as a diffusion inhibition layer for the doped portion of the semiconductor substrate.

2. Related Art

One major problem with using a SiGe or Silicon material is the fast diffusion of n-doped species used to form well implants for pFETs and p-doped species for nFETs into to active device. There is thus a need in the semiconductor industry for a method and structure that obviates the problem of well dopant diffusion into active FinFETs.

SUMMARY

One aspect of the present disclosure includes a semiconductor structure, where the semiconductor structure includes: a substrate, a first punch through stop layer ("PTS layer") over the substrate, and an epitaxial oxide layer directly over the PTS layer where the epitaxial oxide layer is lattice matched in relation to the silicon substrate.

Another aspect of the present disclosure includes a method for forming a semiconductor device, where the method includes: providing a substrate, implanting a portion of the substrate to form a first punch through stop layer ("PTS layer"), and epitaxially growing an oxide layer over the PTS layer where the epitaxial oxide layer is selected to be lattice matched in relation to the silicon substrate.

BRIEF DESCRIPTION OF SEVERAL VIEWS OF THE DRAWINGS

To facilitate understanding, identical reference numerals have been used, where possible, to designate identical elements that are common to the Figures. It is contemplated that elements disclosed in one embodiment may be beneficially utilized on other embodiments without specific recitation.

DETAILED DESCRIPTION

Figure 1:
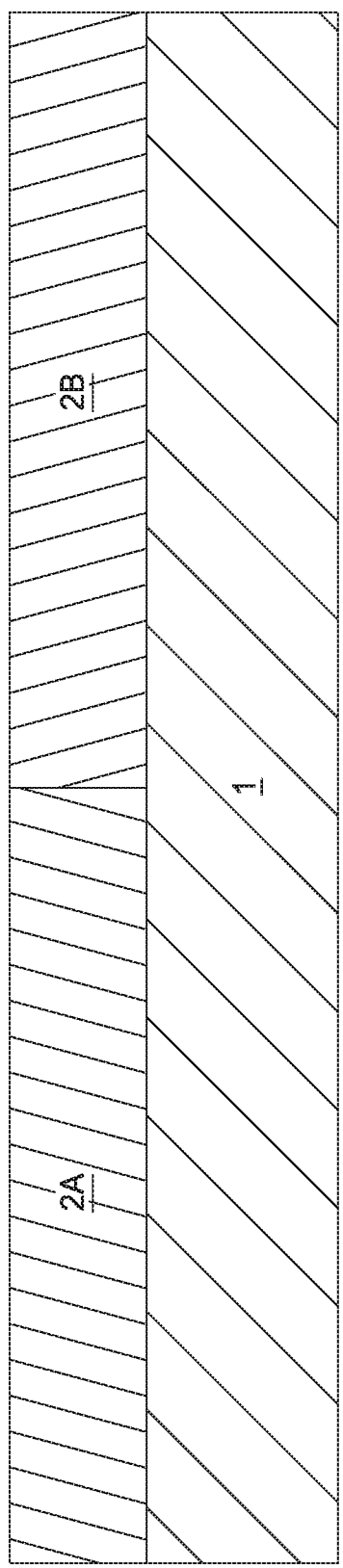
FIG. 1 illustrates a doped semiconductor substrate in accordance with at least one embodiment of the present disclosure.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Aspects of the present disclosure provide structures, and methods of making the same, of a semiconductor device with an epitaxially grown oxide layer over a doped semiconductor structure. In certain embodiments, the epitaxially grown oxide is lattice matched to the underlying semiconductor substrate such that it operates as a diffusion layer with respect to the doped portions of the substrate in order to prevent the dopants from adversely interfering with the ultimate device structure, e.g., fins, and functionality associated therewith, where in one embodiment, with the epitaxial oxide being lattice matched to the substrate, the epitaxial oxide layer can act as a template for subsequently grown device fins, e.g. silicon and/or silicon-germanium fins, formed thereon. In one embodiment, the thickness of the epitaxial oxide layer is controlled so that it maintains its functionality as a diffusion layer, without interfering with other device/material properties, including interference by the adverse effects caused by the oxide's insulator properties. In one embodiment, as implied, the epitaxial oxide layer allows for very high well doping, e.g. super steep retrograde well, near a surface of a substrate, without causing the adverse consequences associated with dopant moving into the active area of the device, e.g. fins. In the later embodiment, the structure allows for fairly high well doping near the surface without to danger of the dopant moving in the active device.

Referring first to FIG. 1, there is illustrated an exemplary semiconductor structure that includes a semiconductor substrate 1, where the substrate 1 can be a single crystalline semiconductor material. In one embodiment, the substrate is a silicon substrate 1, e.g. is pure silicon (Si) or essentially pure silicon. The silicon substrate 1 may have any of the well-known crystal orientations. For example, the crystal orientation of the silicon substrate 1 may be {100}, {110}, or {111}. Other crystallographic orientations besides those specifically mentioned can also be used in the present application. Furthermore, referring now to FIG. 1, there is illustrated a formation, in any order, of a p-well region 2A in a first region of the silicon substrate 1, and an n-well region 2B in a second region of the silicon substrate. In one embodiment, the dopant employed for the p-well region can be boron, and the n-dopant can be either arsenic or phosphorous. In one embodiment, a sidewall surface of the p-well region 2A is in direct physical contact with a sidewall surface of the n-well region 2B, and in another embodiment, e.g. where STI techniques are employed as discussed below, there can be no direct contact.

In accordance with the present application and one embodiment, the p-well region 2A includes boron (B) incorporated into the first region of the silicon substrate 1, while the n-well region 2B includes arsenic (As) incorporated into the second region of the silicon substrate 1. In some embodiments, the p-well region 2A is formed prior to forming the n-well region 2B. In such an embodiment, a block mask is formed over the silicon substrate 1, while leaving the first region of the silicon substrate 1 exposed. The block mask may include a photoresist, a hard mask material or a material stack of, from bottom to top, a hard mask material, and a photoresist. The block mask can be formed utilizing techniques well known in the art. Boron or another type of p-dopant is then implanted into the exposed first region of the silicon substrate 1 with the block mask in place utilizing ion implantation conditions that are well known to those skilled in the art. A diffusion anneal may follow the ion implantation of boron or another type of p-dopant into the first region of the silicon substrate 1. After boron incorporation, the block mask located over the second region is removed and then another block mask is formed over the first region that now contains the p-well region 2A. Arsenic, phosphorous, or another type of n-dopant is then implanted into the exposed second region of the silicon substrate 1 with another block mask in place utilizing ion implantation conditions that are well known to those skilled in the art. In one embodiment, after the block mask(s) is removed, a diffusion anneal may follow the ion implantation of arsenic, phosphorous, or another type of n-dopant into the second region of the silicon substrate 1, where according to one embodiment, the diffusion anneal occurs simultaneously for both species of implanted dopant, and in some embodiments, activation anneal is used after introducing boron and arsenic into the respective regions of silicon substrate. The block mask covering the p-well region 2A is removed after the introduction of arsenic, phosphorous, or another type of n-dopant into the second region of the silicon substrate 2B.

In some embodiments, the n-well region 2B is formed prior to forming the p-well region 2A. In such an embodiment, the above steps of block mask formation and ion implantation are reversed.

In one embodiment, diffusion annealing will occur after the development of the epitaxial oxide layer and material layers suitable for fin formation, as described below. This can ensure that, according to an embodiment, a high dopant concentration is present at the boundary of the epitaxial oxide layer (discussed below) and the respective well regions.

In one embodiment, the top of p-well region 2A contains boron in a concentration from $5\times10^{18}$ atoms/cm$^3$ to $5\times10^{19}$ atoms/cm$^3$, and the top of the n-well region 2B contains arsenic in a concentration from $5\times10^{18}$ atoms/cm$^3$ to $5\times10^{19}$ atoms/cm$^3$.

In one embodiment, the doping of the doped regions 2A and 2B is done such that a retrograde well (super steep retrograde well=SSRW) (not expressly shown) is formed in or on the substrate 1. More particularly, the SSRW is developed such that there is a varying gradient in doping concentration within doped regions 2A and 2B. In one embodiment, the diffusion annealing described above is performed once the epitaxial oxide layer (discussed below) and semiconductor material layers suitable for fin formation (described below) are formed, which in turn contributes to a scenario where the dopant concentration at the interface of the epitaxial oxide layer 3 (discussed below) and the doped regions 2A and 2B can be highest in relation to the doping of the rest of the regions 2A and 2B, and the doping can be as outlined above, with one embodiment involving a particularly high overall dopant concentration, e.g. greater or equal to $5\times10^{19}$ atoms/cm$^3$ for the regions 2A and 2B. Normally, this could present a problem with dopant diffusion occurring in the channel structure of the operative structure of the device, e.g. fins, as the high dopant concentration at the interface could cause dopants to travel into the fin structure and degrade the device. Traditional prior art techniques attempt to remedy the problem by having a doped inter layer, such as a carbon doped silicon interlayer between the fin channel and the respective doped regions, without employing the techniques of the present disclosure. However, this still has certain disadvantages, including that diffusion is still relatively high, scaling is problematic as smaller dimensions are pursued, and, in the case of using a carbon doped silicon interlayer, an additional low temperature STI step is required to make the interlayer effective. As will become apparent from the below discussion, the introduction of the epitaxial oxide layer 3, in accordance with the techniques of the present disclosure, permits having doped well regions, e.g. 2A and 2B, under an epitaxial layer, e.g. 3, that joins the doped well regions with the fin or final device structure, without having the previously mentioned disadvantages, but while nevertheless also preserving the advantages of SSRW doping, including reducing voltage variability.

Consequently, pursuant to the above discussion, in one embodiment, FIG. 1 illustrates a silicon substrate with well implant, with the top portion of the well implant now referred to as a p-type punch through stop layer ("PTS layer") and an n-type punch-through stop layer ("PTS layer), where, in one embodiment, the p-type PTS layer is doped with boron and the n-type punch through stop layer is doped with arsenic The doping of each portion of the substrate 1 with an n-type/p-type dopant serves to form an n-region and p-region of the device, which in turn permits proper electron//hole mobility through the device. In one embodiment, the doping of the p-type and n-type doping is such that SSRW wells are developed in the p-doped and n-doped regions, e.g. 2A and 2B, respectively, and where the dopant concentrations of the p-doped and n-doped regions is high. As will be discussed below, in certain embodiments, the epitaxial oxide layer 3 will be selected such that its lattice and dimensional matched, relative to the substrate 1, characteristics do not impede each doped region's (2A and 2B) proper characteristics.

Figure 2:
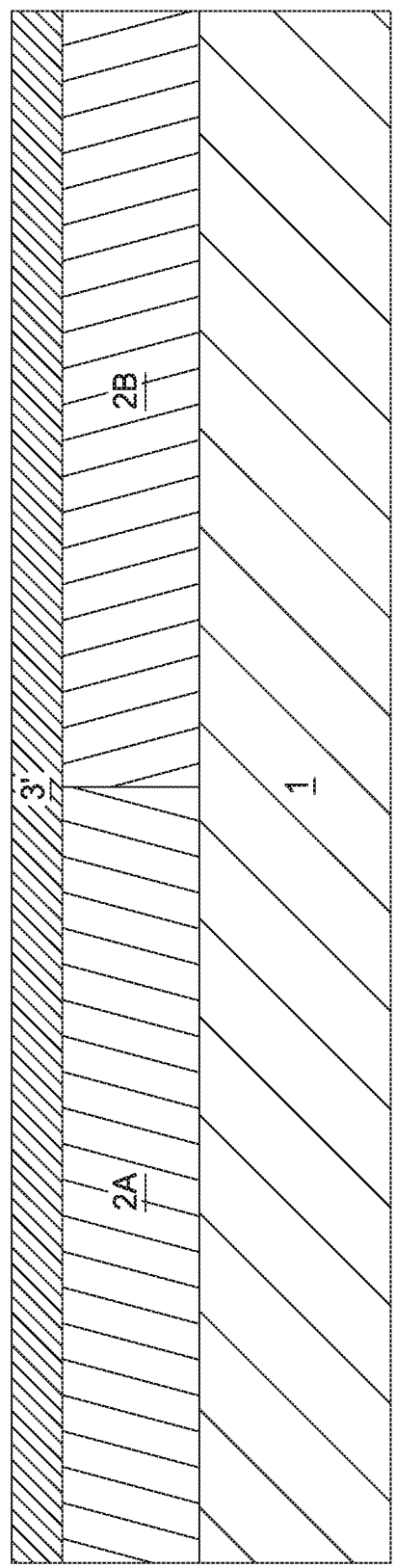
FIG. 2 illustrates the doped silicon substrate of FIG. 1 with an epitaxially grown oxide layer over the doped semiconductor substrate in accordance with at least one embodiment of the present disclosure.

FIG. 2 depicts forming an epitaxial oxide layer 3 over the doped portions of the silicon substrate 1, e.g. over the PTS layer(s) of the silicon substrate 2. The epitaxial oxide layer 3 may be selected to have a lattice dimension substantially similar to the lattice dimension of the silicon substrate 1. In one embodiment, the epitaxial oxide layer 3 is a diffusion blocking layer which maintains the lattice structure from the underlying silicon substrate 1. The epitaxial oxide layer 3 can retard the dopants contained in the doped portion of the silicon substrate, e.g. in one embodiment, as described above, the dopants will be boron and arsenic, thus containing the well and PTS dopant within their desired areas. This in turn prevents the subsequent device functionality of the layers and components developed above the epitaxial oxide layer 3, e.g., a plurality of fins, from being compromised. In one embodiment, when the epitaxial oxide layer 3 is a thin epitaxial layer, e.g., between 2 nm to 10 nm in thickness in the vertical direction, it remains an effective diffusion blocking layer, while minimizing any effects that can inhibit mobility as a result of the oxide's insulator characteristics. The previously mentioned embodiments are useful in general when dealing with underlying doped regions, but particularly useful, as discussed above, when an SSRW well is developed with a high dopant concentration, as the epitaxial oxide layer 3 retards the respective dopants from entering the device region, e.g. fins.

In one example, the epitaxial oxide layer 3 is made from a lanthanum (La), yttrium (Y) and oxygen (O) containing material, which has a lattice dimension that can be closely matched to a silicon lattice. In one embodiment, the epitaxial oxide 3 that is composed of lanthanum, yttrium and oxygen can be a $(La_xY_{1-x})_2O_3$ alloy. The epitaxial oxide layer 3 that contains a lanthanum, yttrium and oxygen alloy, e.g., $(La_xY_{1-x}O_3$ alloy, may be epitaxially deposited. In an embodiment where the substrate 1 is silicon (Si), X=0.33 for the lanthanum and yttrium containing material, which allows for a perfect lattice match between the silicon substrate 1 and the epitaxial oxide layer 3. In this embodiment, the lattice constant of the lanthanum and yttrium compound will be twice that of pure silicon. In this embodiment, and in other embodiments where the yttrium portion is the majority of the lanthanum and yttrium containing material, the lanthanum and yttrium material can crystalize in the cubic structure in relation to the silicon substrate 1. In another embodiment, cerium oxide ($CeO_2$) can also be employed as the material for the epitaxial oxide layer 3 where the substrate 1 is a silicon substrate, as cerium oxide can be grown over the silicon substrate such that it is substantially lattice matched in relation thereto. In other embodiments, including where a substrate 1 includes silicon and another material, the concentration of the lanthanum and yttrium can be adjusted to achieve a suitable lattice match. Other examples of epitaxial oxides that are suitable for use as the epitaxial oxide layer 3, including but not limited to scenarios where a different material other than silicon is employed for the substrate 1, can be selected from the group consisting of cerium oxide ($CeO_2$), aluminum oxide ($Al_2O_3$), lanthanum oxide ($La_2O_3$), yttrium oxide ($Y_2O_3$), ytterbium oxide ($Yb_2O_3$), gadolinium oxide ($Gd_2O_3$), europium oxide ($Eu_2O_3$), erbium trioxide ($Er_2O_3$), dysprosium oxide ($Dy_2O$), holmium oxide ($Ho_2O_3$), thulium oxide ($Tm_2O_3$), lutetium oxide ($Lu_2O_3$), terbium oxide, ($Tb_2O_3$), hafnium oxide ($HfO_2$) or combinations thereof.

"Epitaxial growth and/or epitaxial deposition" means the growth of a semiconductor material on a deposition surface of a semiconductor material, in which the semiconductor material being grown has substantially the same crystalline characteristics as the semiconductor material of the deposition surface. The term "epitaxial material" denotes a semiconductor material that has substantially the same crystalline characteristics as the semiconductor material that it has been formed on, i.e., epitaxially formed on. In some embodiments, when the chemical reactants are controlled, and the system parameters set correctly, the depositing atoms of an epitaxial deposition process arrive at the deposition surface with sufficient energy to move around on the surface and orient themselves to the crystal arrangement of the atoms of the deposition surface. An epitaxial material has substantially the same crystalline characteristics as the semiconductor material of the deposition surface. For example, an epitaxial film deposited on a {100} crystal surface, e.g., the epitaxial oxide, will take on a {100} orientation.

In some embodiments, when the epitaxial oxide layer 3 is composed of a lanthanum, yttrium and oxygen containing material, e.g. metastable $(La_xY_{1-x})_2O_3$ alloy, the epitaxial oxide may be formed using molecular beam epitaxial (MBE) deposition. In MBE, material is sublimated (or evaporated in the case of a liquid source) from effusion cells, thus forming molecular beams that are incident upon a heated sample, i.e., deposition surface. In MBE, the molecules of the deposited material land on the surface of the substrate, condense, and build up slowly and systematically, i.e., providing epitaxial growth.

Figure 3:
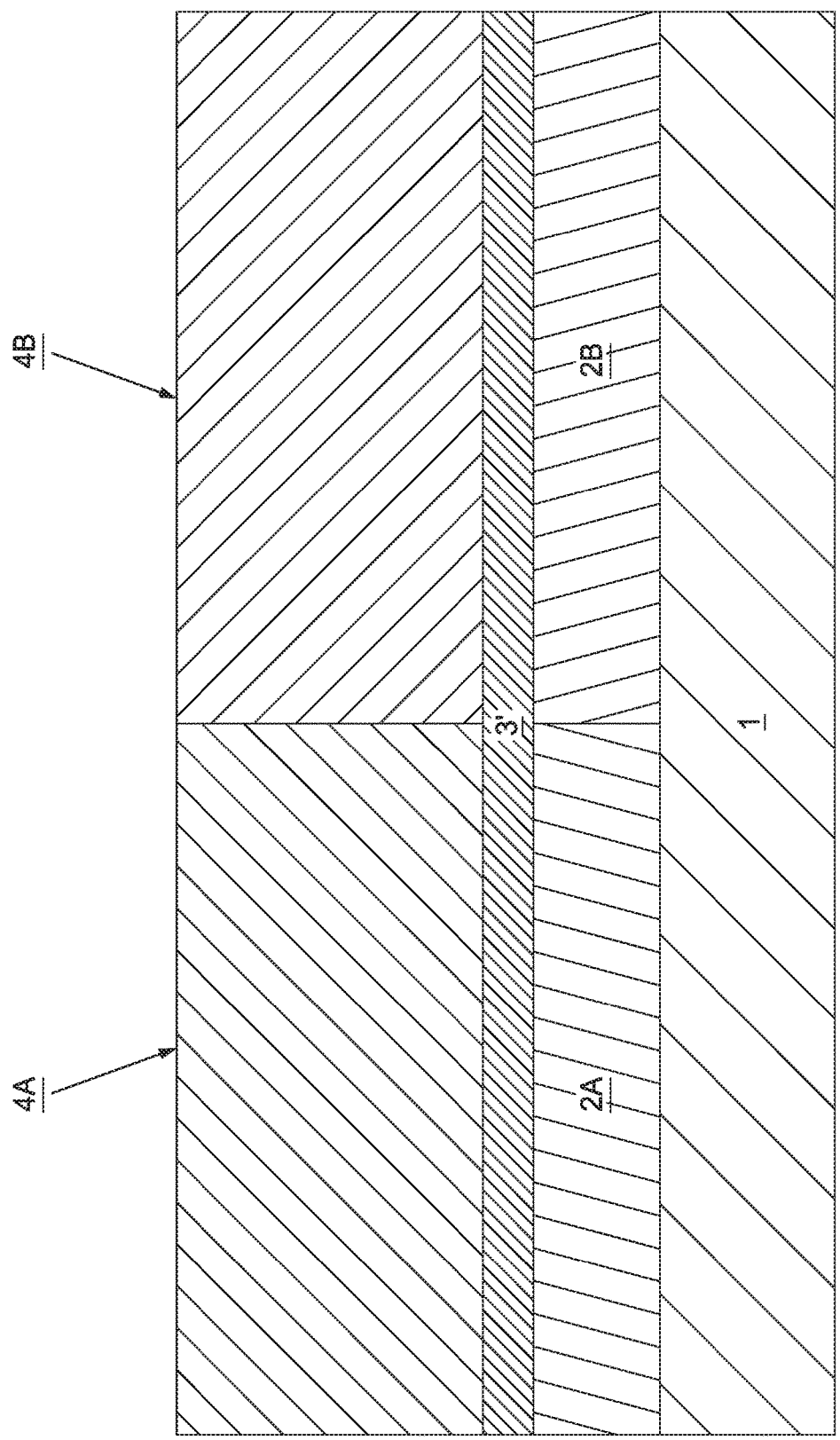
FIG. 3 illustrates the semiconductor structure of FIG. 2 with at least two semiconductor material layers over the epitaxially grown oxide layer in accordance with at least one embodiment of the present disclosure.

FIG. 3 illustrates an exemplary semiconductor structure of FIG. 2 after forming, in any order, a material layer 4A on the p-well region 2A, and a material layer 4B on the n-well region 2B.

In one embodiment of the present disclosure, the material layer 4A is formed prior to forming the material layer 4B. It should be noted that in one embodiment, layers 4A and 4B can be silicon (Si) material layers, i.e. essentially pure silicon, and in other embodiments one layer, e.g. 4A, can be a silicon containing material, i.e. essentially pure silicon, and the other layer, e.g. 4B, can be a germanium (Ge) containing material layer, such as silicon-germanium (SiGe). In an embodiment, a block mask as defined above is formed over the n-well region 2B utilizing conventional techniques well known to those skilled in the art, where layer 4A is silicon containing material layer and layer 4B is a germanium-containing material layer. With the block mask in place, the silicon material layer 4A can be formed over the p-well region 2A and the epitaxial oxide layer 3, which in turn is over the p-well region 2A (and the n-well region 2B). The silicon material layer 4A can be formed utilizing an epitaxial growth (deposition) process as mentioned above, and can employ a silicon-containing precursor(s), e.g. as discussed below or with otherwise suitable alternatives. The silicon material layer 4A may have a deposited thickness from 20 nm to 250 nm. In one embodiment, the epitaxial oxide layer 3 serves as the crystalline template for the epitaxially grown silicon material layer 4A (and also for material layer 4B when it is composed of pure or essentially pure silicon). In another embodiment, the epitaxial oxide layer 3 serves as the crystalline template for the epitaxially grown silicon material layer 4A, and when material layer 4B is a germanium containing layer 4B, such as silicon-germanium, material layer 4B will be strained in relation thereto. Next, and after epitaxial growth of the silicon material layer 4A, the block mask is removed and then another block mask is formed over the silicon material layer 4A. In one embodiment, although not expressly shown, the material layer 4A and material layer 4B can be a single layer, e.g. when silicon fins will be developed over both doped regions, and in this embodiment, silicon can be formed in a single step over both well regions, e.g. 2A and 2B, without using a hard mask.

In an embodiment, also not expressly shown, and utilizing the techniques described in the present disclosure, a silicon material layer, e.g. 4A, would be epitaxially grown over the entirety of the epitaxial oxide layer 3. A hard mask would be placed over a portion of the silicon material layer 4A and the exposed portion would be recessed until the epitaxial oxide layer 3 is exposed. Thereafter, from the exposed portion of the epitaxial oxide layer 3, a silicon-germanium material layer 4B would be epitaxially grown thereon. This embodiment can minimize crystalline defects that may materialize from contact with the mask sidewall.

Layer 4A and 4B can be grown over the respective p-well and n-well regions, e.g. 2A and 2B, utilizing an epitaxial growth (deposition) process, as mentioned above, employing a silicon and germanium-containing precursor(s) that is (are) well known to those skilled in the art. For example, the epitaxial semiconductor material may be composed of silicon (Si), germanium (Ge), silicon germanium (SiGe) and other semiconductor materials. The epitaxial deposition process may employ the deposition chamber of a chemical vapor deposition type apparatus, such as a PECVD apparatus. In some embodiments, the gas source for the epitaxial deposition of the epitaxial semiconductor material stacked structure may include silicon deposited from silane, disilane, trisilane, tetrasilane, hexachlorodisilane, tetrachlorosilane, dichlorosilane, trichlorosilane, disilane and combinations thereof. The temperature for epitaxial silicon germanium deposition typically ranges from 450° C. to 900° C. (Although higher temperature typically results in faster deposition, the faster deposition may result in crystal defects and film cracking). In some embodiments, the gas source, including where a silicon-germanium layer is employed, can be germane, digermane, trigermane, tetragermane, hexachlorodigermane, tetrachlorogermane, dichlorogermane, trichlorogermane, digermane and combinations thereof.

In one embodiment, when the material layer 4B is a germanium-containing material, the germanium-containing layer 4B is a silicon-germanium (SiGe) layer. In some embodiments, the germanium-containing layer 4B has a germanium content from 10 atomic percent to 30 atomic percent germanium. In another embodiment the germanium content can be between 20 percent to 50 percent germanium. The germanium-containing layer 4B may have a deposited thickness from 20 nm to 250 nm, and will have the same thickness as the silicon material layer 4A. Next, and after epitaxial growth of the germanium-containing layer 4B, the another block mask is removed.

In certain embodiments, as stated, the germanium-containing layer 4B has a same thickness as the silicon material layer 4A; in such an embodiment, the topmost surfaces of the germanium-containing layer 4B and the silicon material layer 4A can be coplanar with each other. In other embodiments, the germanium-containing layer 4B has a different thickness than the silicon material layer 4A; in such an embodiment, the topmost surface of the germanium-containing layer 4B is vertically offset from a topmost surface of the silicon material layer 4A. In such an embodiment, a planarization process can be used to remove the offset. In some embodiments, both the thickness of the silicon-germanium layer 4B and the silicon layer 4A are selected such that the silicon-germanium layer 4B will remain under its critical thickness, avoiding relaxation of the deposited silicon-germanium material.

In some embodiments, the material layer 4A is formed after forming the material layer 4B. In this embodiment, the order of block mask formation and epitaxial growth as mentioned above can be reversed, and as discussed and implied above, when the material layers (4A and 4B) are of the same material, a single step without a mask can be employed to deposit the layers.

In an embodiment, as discussed above, instead of performing a diffusion anneal during the well formation steps discussed with respect to FIG. 1, the diffusion anneal step takes places after formation of the epitaxial oxide layer 3, the material layer 4A and the material layer 4B. This ensures optimal dopant concentration in the epitaxial oxide layer, and particularly, at the interface with the well regions, e.g. 2A and 2B.

Figure 4:
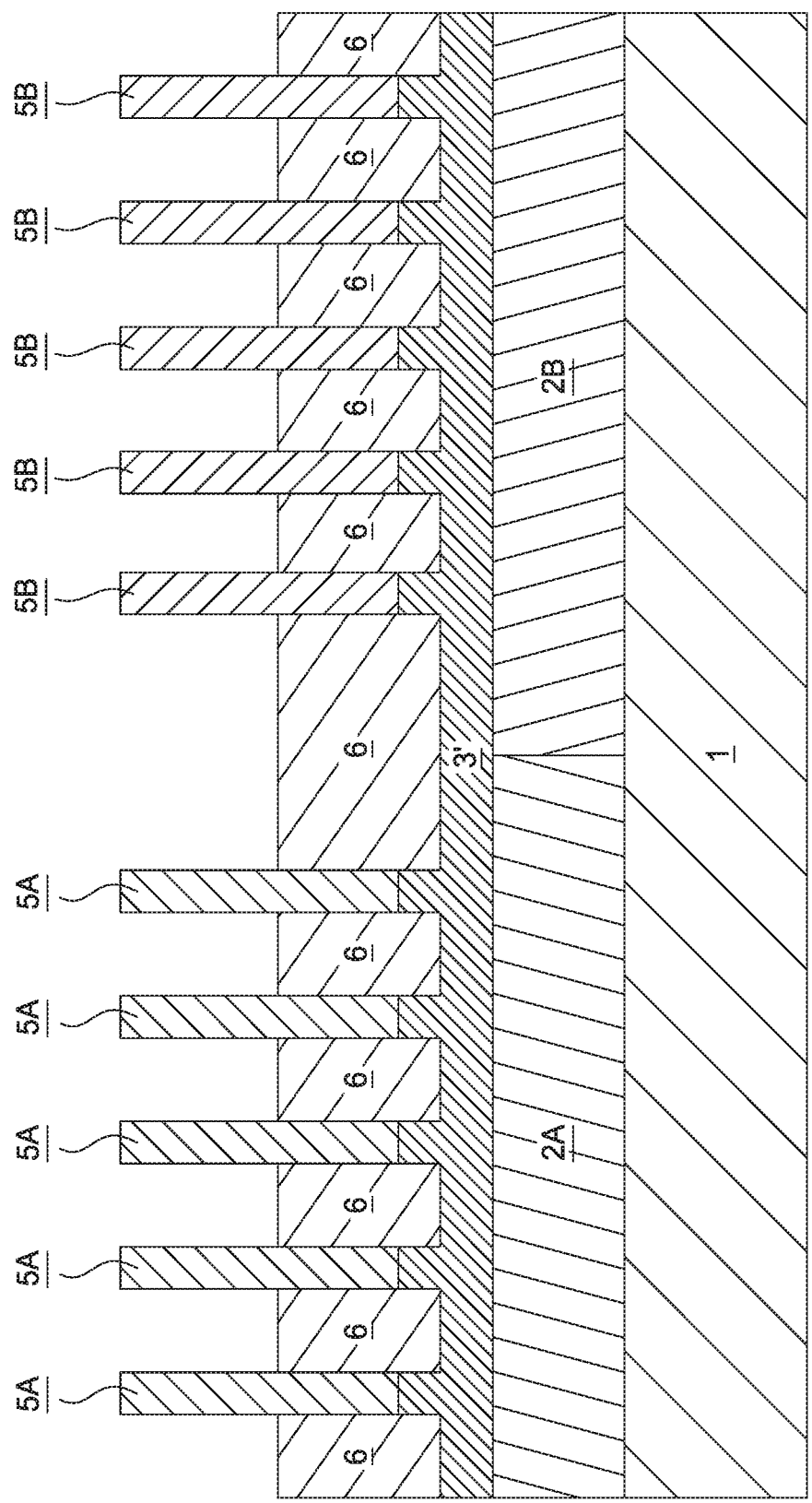
FIG. 4 illustrates a semiconductor structure with an epitaxial oxide layer and a plurality of fins over the epitaxial oxide layer in accordance with at least one embodiment of the present disclosure.

Referring now to FIG. 4, there is illustrated the exemplary semiconductor structure of FIG. 3 after patterning the material layer 4A and the layer 4B to provide at least one fin 5A and at least one fin 5B, respectively. In one embodiment, fin 5A is a silicon containing fin 5A, and in a more particular embodiment, fin 5A is a silicon fin, i.e. consisting of pure or essentially pure silicon (Si). In one embodiment, fin 5B is a germanium-containing fin, and in a more particular embodiment fin 5B is a silicon-germanium (SiGe) fin. In one embodiment, both fin 5A and fin 5B are pure silicon (Si).

In one embodiment, the patterning process used to define the fins 5A and 5B may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer which can be composed of any material that has a different etch selectivity than the mandrel material can be formed by deposition of a spacer material and then etching the deposited spacer material. In one example, the spacer material may be composed of any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching. After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet another embodiment, the patterning process may include a direct self-assembly (DSA) patterning process.

As used herein, a "fin" refers to a contiguous semiconductor material, and including a pair of vertical sidewalls that are parallel to each other. As used herein, a surface is "vertical" if there exists a vertical plane from which the surface does not deviate by more than three times the root mean square roughness of the surface. In one embodiment of the present application, each semiconductor fin (5A, 5B) may have a width from 4 nm to 12 nm; the height of each semiconductor fin (5A, 5B) may be from 30 nm to 150 nm. Other widths and heights that are lesser than, or greater than the ranges mentioned herein can also be used in the present application.

In some embodiments of the present application, and as shown, the etch used to define the semiconductor fins (5A, 5B) may remove exposed portions of the p-well region 2A and n-well region 2B. As is shown, each silicon containing fin 5A is located on a portion of the p-well region 2A, and each germanium containing fin 5B is located on a portion of the n-well region 2B.

Although not expressly shown in FIG. 4, the resulting nFET and pFET regions that include the fins 5A and 5B are electrically isolated by a shallow trench isolation (STI) region (not shown) that is formed during the fabrication process, i.e. in one embodiment the STI process begins after the growth of the material layers 4A and 4B. A trench (not expressly shown) is formed in the structure, for example by reactive ion etching, down to the substrate 1. Patterning techniques familiar to those skilled in the art facilitate trench formation and subsequent filling of the trench with one or more electrically insulating material(s), to form an STI layer 6, such as silicon dioxide. Shallow trench isolation (STI) provides a region that electrically isolates active areas of the structure.

Although the above disclosure provides illustrative examples with a silicon substrate, boron and arsenic dopants, and fins composed of silicon and silicon-germanium, other configurations are possible that include a variety and combination of type III-V materials, type IV materials, type II materials, etc. and other n-type and p-type dopants; provided, however, that the selection is in accordance with the teachings of the above disclosure, including as described for certain embodiments, where the epitaxial oxide material that will form the basis for the epitaxial oxide layer is selected so that it is latticed matched to the underlying semiconductor substrate material, whether it be type III-V, type IV, etc., and provided the dopants are selected to be adequate p-type or n-type dopants for the material selected to constitute the underlying semiconductor substrate. Finally, the fins, or end desired semiconductor device structure, should also be selected to be compatible with the material selections.

Certain embodiments described above provide an epitaxial oxide layer 3 that can offer several benefits, including being generally useful in operating as a diffusion barrier layer that prevents dopants from doped regions, e.g. 2A and 2B, from entering operable portions of a device, e.g. fins. In certain embodiments, the epitaxial layer can be between 2 nm-10 nm in depth, which can minimize adverse insulation effects. In one embodiment an SSRW doped well is provided over or in a substrate 1, and the epitaxial oxide layer 3 is composed of a material, such as a rare earth material, that is selected to be substantially lattice matched to the underlying substrate, e.g. a lanthanum-yttrium containing material for a silicon substrate 1, such that the benefits of an SSWR well are preserved, while dramatically diminishing the effects associated therewith, including those stemming from dopant diffusion due to a high dopant concentration. In other embodiments, as discussed, the epitaxial oxide layer 3 can still be employed outside of the SSRW scheme, as it is generally useful as a dopant diffusion blocking layer.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
   a silicon (Si) substrate;
   a first punch through stop (PTS) layer over the substrate, the PTS layer having a varying gradient in doping concentration; and
   an epitaxial oxide layer disposed on the PTS layer, wherein the epitaxial oxide layer is lattice matched in relation to the substrate, wherein the doping concentration in the PTS layer is highest at an interface between the PTS layer and the epitaxial oxide layer, and wherein the epitaxial oxide layer is a diffusion blocking layer with a thickness between 2 nm 10 nm in thickness a fin of a FinFET formed on the epitaxial oxide layer.

2. The semiconductor structure of claim 1, wherein the first PTS layer is a doped portion of the substrate.

3. The semiconductor structure of claim 2 further comprising:
   a second PTS layer over the substrate, wherein the second PTS layer is a doped portion of the substrate and in contact with and adjacent to the first PTS layer.

4. The semiconductor structure of claim 3, wherein the first PTS layer is doped with a p-dopant and the second PTS layer is doped with an n-dopant, and wherein the epitaxial oxide layer includes lanthanum yttrium oxide ($LaYO_3$).

5. The semiconductor structure of claim 4 further comprising:
   a plurality of fins disposed on the epitaxial oxide layer, wherein the plurality of fins are over both the first and second PTS layers.

6. The semiconductor structure of claim 5, wherein a portion of the plurality of fins over the epitaxial oxide layer are silicon fins over the first PTS layer and another portion of the plurality of fins over the epitaxial oxide layer are silicon-germanium fins over the second PTS layer, and wherein the n-dopant for the first PTS layer is arsenic and the p-dopant for the second PTS layer is boron.

7. A method for forming a semiconductor device comprising:
providing a substrate;
implanting a portion of the substrate to form a (punch-through stop) PTS layer, the PTS layer having a varying gradient in doping concentration; and
epitaxially growing an oxide layer disposed on the PTS layer, wherein the doping concentration in the PTS layer is highest at an interface between the PTS layer and the epitaxial oxide layer, and wherein the epitaxial oxide layer is selected such that it is lattice matched in relation to the substrate and wherein a thickness of the epitaxial oxide layer is selected such that the epitaxial oxide layer i) operates as a diffusion blocking layer and ii) maintains electron and hole mobility through the semiconductor device a fin of a FinFET formed on the epitaxial oxide layer.

8. The method according to claim 7, wherein the epitaxial oxide layer is an $(La_xY_{1-x})_2O_3$ alloy.

9. The method according to claim 7, wherein the portion of the substrate to form a PTS layer is a first portion, and further comprising:
implanting a second portion of the substrate to form a second PTS layer, wherein a dopant of the first portion differs from a dopant of the second portion, and wherein the second PTS layer is in contact with and adjacent to the PTS layer.

10. The method according to claim 9, wherein the epitaxial oxide layer is between 2 nm-10 nm in depth.

11. The method according to claim 9, wherein the first portion is doped with a p-dopant and the second portion is doped with an n-dopant, and wherein the epitaxial oxide layer includes lanthanum yttrium oxide ($LaYO_3$).

12. The method according to claim 11, wherein the substrate is a silicon substrate.

13. The method according to claim 12 further comprising:
epitaxially growing a first semiconductor material layer suitable for fin formation over the epitaxial oxide layer and the PTS layer.

14. The method according to claim 13 further comprising:
developing a first set of fins from the first epitaxially grown semiconductor material layer over the PTS layer.

15. The method according to claim 14 further comprising:
epitaxially growing a second semiconductor material layer suitable for fin formation over the epitaxial oxide layer and the second PTS layer; and
developing a second set of fins from the second epitaxially grown semiconductor material layer, wherein the n-dopant for the second PTS layer is arsenic and the p-dopant for the PTS layer is boron.

* * * * *